United States Patent
Adusumilli et al.

(10) Patent No.: US 10,727,070 B2
(45) Date of Patent: Jul. 28, 2020

(54) LINER-LESS CONTACT METALLIZATION

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/137,182

(22) Filed: Sep. 20, 2018

(65) Prior Publication Data
US 2019/0035634 A1    Jan. 31, 2019

Related U.S. Application Data

(63) Continuation-in-part of application No. 15/076,412, filed on Mar. 21, 2016.

(51) Int. Cl.
*H01L 21/285* (2006.01)
*H01L 29/66* (2006.01)
(Continued)

(52) U.S. Cl.
CPC .... *H01L 21/28518* (2013.01); *H01L 21/3213* (2013.01); *H01L 21/76877* (2013.01); *H01L 21/76879* (2013.01); *H01L 23/485* (2013.01); *H01L 23/53242* (2013.01); *H01L 23/53257* (2013.01); *H01L 23/53266* (2013.01); *H01L 27/0924* (2013.01); *H01L 29/41791* (2013.01); *H01L 29/665* (2013.01); *H01L 21/28556* (2013.01); *H01L 21/76843* (2013.01); *H01L 21/76855* (2013.01); *H01L 29/0847* (2013.01);
(Continued)

(58) Field of Classification Search
None
See application file for complete search history.

(56) References Cited

U.S. PATENT DOCUMENTS 5,407,855 A    4/1995    Maniar et al.
5,985,713 A    11/1999   Bailey
(Continued)

OTHER PUBLICATIONS

Yang, C.-C. et al., Physical, Electrical and Reliability Characterization of Ru for Cu Interconnects, International Interconnect Technology conference, Jun. 2006, pp. 187-189, IEEE.
(Continued)

*Primary Examiner* — Erik Kielin
(74) *Attorney, Agent, or Firm* — Daniel P. Morris, Esq.; Hoffmann & Baron, LLP

(57) ABSTRACT

A low resistance middle-of-line interconnect structure is formed without liner layers. A contact metal layer is deposited on source/drain regions of field-effect transistors and directly on the surfaces of trenches within a dielectric layer using plasma enhancement. Contact metal fill is subsequently provided by thermal chemical vapor deposition. The use of low-resistivity metal contact materials such as ruthenium is facilitated by the process. The process further facilitates the formation of metal silicide regions on the source/drain regions.

4 Claims, 2 Drawing Sheets

(51) Int. Cl.
*H01L 21/3213* (2006.01)
*H01L 21/768* (2006.01)
*H01L 29/417* (2006.01)
*H01L 29/08* (2006.01)
*H01L 29/165* (2006.01)
*H01L 23/532* (2006.01)
*H01L 27/092* (2006.01)
*H01L 23/485* (2006.01)

(52) U.S. Cl.
CPC ...... *H01L 29/165* (2013.01); *H01L 29/66545* (2013.01)

(56) References Cited

U.S. PATENT DOCUMENTS

| | | | |
|---|---|---|---|
| 6,479,100 B2 | 11/2002 | Jin et al. | |
| 6,664,175 B2 | 12/2003 | Jiang et al. | |
| 7,285,308 B2 | 10/2007 | Hendrix et al. | |
| 2002/0137335 A1 | 9/2002 | Won et al. | |
| 2002/0146513 A1* | 10/2002 | Jin | C08F 14/06 427/255.28 |
| 2003/0119315 A1* | 6/2003 | Park | H01L 21/28556 438/686 |
| 2005/0266631 A1 | 12/2005 | Kim et al. | |
| 2006/0251800 A1 | 11/2006 | Weidman et al. | |
| 2008/0124484 A1 | 5/2008 | Shinriki et al. | |
| 2010/0078815 A1 | 4/2010 | Wang et al. | |
| 2011/0042775 A1 | 2/2011 | Doi et al. | |
| 2012/0261829 A1* | 10/2012 | Lin | H01L 21/76814 257/774 |
| 2014/0284802 A1 | 9/2014 | Sakata et al. | |
| 2017/0271512 A1 | 9/2017 | Adusumilli et al. | |

OTHER PUBLICATIONS

Yang, C.-C. et al., Selective Chemical Vapor Deposition-Grown Ru for Cu Interconnect Capping Applications, Electrochemical and Solid-State Letters, 13(5), May 2010, pp. D33-D35.

Kang, Sang Yeol et al., Improvements in Growth Behavior of CVD Ru Films on Film Substrates for Memory Capacitor Integration, Journal of the Electrochemical Society, 152(1), Jan. 2005, pp. C15-C19.

IBM, "List of IBM Patents or Patent Applications Treated As Related", Sep. 2018, pp. 1-2.

* cited by examiner

LINER-LESS CONTACT METALLIZATION

CROSS REFERENCE TO RELATED APPLICATION

The present application is a continuation-in-part of U.S. patent application Ser. No. 15/076,412, "Liner-less contact metallization", filed Mar. 21, 2016, the complete disclosure of which is expressly incorporated herein by reference in its entirety for all purposes.

BACKGROUND

The present disclosure relates generally to the electrical, electronic and computer arts and, more particularly, to contacts for field-effect transistors (FETs) and their fabrication.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

The contribution of middle-of-line (MOL) contact resistance to the total parasitic resistance is increasing due to aggressive dimensional scaling in advanced CMOS devices. Titanium (Ti), titanium nitride (TiN) and tungsten (W) layers are used as liner/barrier/nucleation layers in MOL metallization and help ensure adequate adhesion. These layers occupy an increasing amount of the interconnect volume. Interfacial contact resistance between two interconnect levels is dominated by liner/barrier/nucleation layers of some devices.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning. Gate-last procedures can involve making a dummy gate, fabricating other elements of the transistor such as the source/drain regions, removing the dummy gate, and replacing the removed dummy gate with actual gate materials.

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Gate spacers can be formed on sidewalls of each of the disposable gate structures, for example, by deposition of a conformal dielectric material layer and an anisotropic etch. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are ordinarily formed in the gate cavities. Replacement gate structures are formed by replacement of the disposable structures and overlie channel regions of the structures. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

BRIEF SUMMARY

Techniques are provided for forming a liner-less contact/interconnect metallization structure.

In one aspect, an exemplary fabrication method includes obtaining a structure including a plurality of field-effect transistors, each field-effect transistor including source/drain regions, a dielectric layer covering the plurality of field-effect transistors, and trenches extending within the dielectric layer to the source/drain regions. Titanium-based silicide regions are formed on the source/drain regions. A continuous contact metal surface layer is deposited directly on the silicide regions and the dielectric layer within the trenches using a plasma-enhanced deposition process. Subsequent to depositing the continuous contact metal surface layer, the trenches are filled with a contact metal fill layer using thermal chemical vapor deposition.

In another aspect, an exemplary structure includes a plurality of field-effect transistors, each field-effect transistor including source/drain regions, a dielectric layer covering the plurality of field-effect transistors, and trenches extending within the dielectric layer to the source/drain regions. Titanium-based silicide regions are on the source/drain regions. The structure further includes metal contacts, each contact including a continuous contact metal surface layer that directly contacts the silicide regions and the dielectric layer within the trenches and a contact metal fill layer on the continuous contact metal surface layer that fills the trenches. The contact metal fill layer has lower resistivity than the continuous contact metal surface layer.

Techniques as disclosed herein can provide substantial beneficial technical effects. By way of example only and without limitation, one or more embodiments may provide one or more of the following advantages:
Low resistance interconnect structure;
Good adhesion to dielectric materials used in CMOS fabrication;
Elimination of relatively high resistivity liner films.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
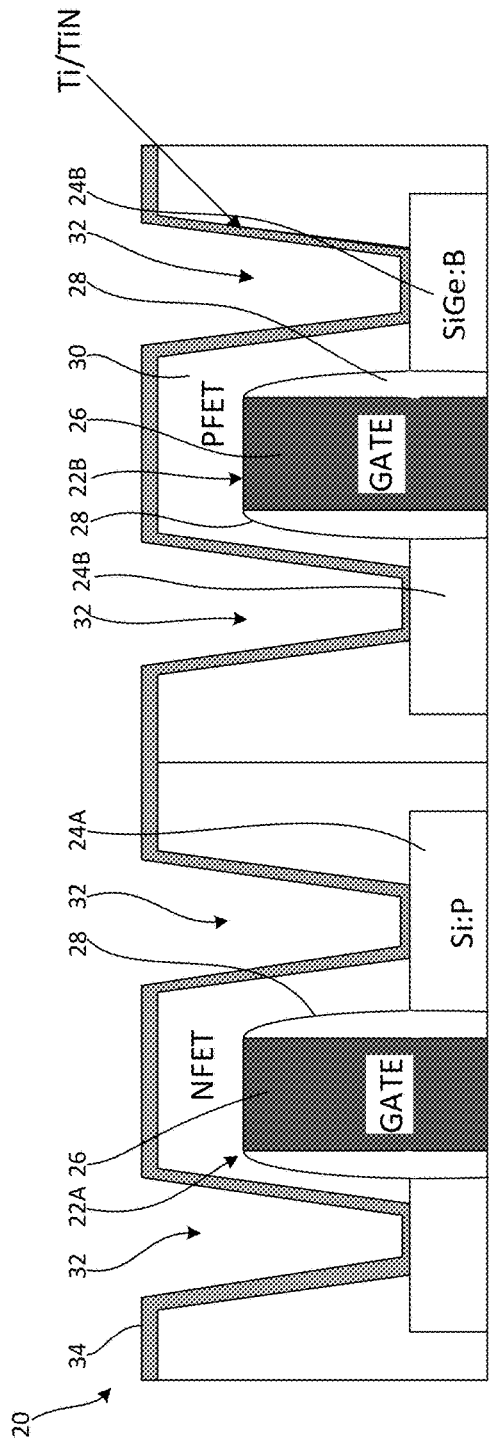
FIG. 1 is a schematic, cross-sectional view of a semiconductor structure including nFET and pFET regions following patterning of a dielectric layer on the structure and deposition of titanium and titanium nitride layers.

FIG. 1 schematically depicts a semiconductor structure 20 including nFET and pFET regions. The nFET region includes nFETs 22A and the pFET region includes pFETs 22B. The nFETs 22A include n-type source/drain regions 24A, for example phosphorus-doped silicon regions. In embodiments wherein the nFETs and pFETs are FinFETs, expanded source/drain regions can be grown epitaxially on the exposed portions of semiconductor fins. Doped silicon or silicon germanium grown epitaxially on the sidewalls (110 surfaces) of silicon fins increases the volumes of the source/drain regions. Either p-type devices or n-type devices can be fabricated depending on the conductivity types of the epitaxial source/drain regions, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorus. In embodiments where n-type FinFET devices are to be formed, in-situ n-doped silicon may be used to form the epitaxial source/drain regions. In-situ doping of the source/drain regions can be conducted using conventional precursor materials and techniques. Source/drain regions 24A consisting essentially of phosphorus-doped silicon is employed in an exemplary embodiment. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $4-9 \times 10^{20}$ $cm^{-3}$ and the resulting FinFET structure is p-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Fin sidewall surfaces are (110) surfaces in one or more embodiments such that epitaxial growth thereon produces in diamond-shaped structures due to the fact that the growth rate on (111) planes is considerably less than on (110) planes. Self-limiting diamond-shaped structures can accordingly be formed. Growth may be limited in some exemplary embodiments to avoid merging of the faceted source/drain regions. It will be appreciated that doped source/drain regions can be formed using other known methods including but not limited to implantation and diffusion doping techniques. It will further be appreciated that many of the principles discussed herein can be applied to various types of field-effect transistors, including planar devices.

In addition to source/drain regions, the field-effect transistors 22A, 22B include gate regions 26, spacers 28 adjoining the gate regions, and channel regions operatively associated with the gate regions and source/drain regions. In embodiments including FinFETs, the channel regions include portions of fins within the gate regions. The gate regions include gate dielectric and gate conductor portions which may or may not be the same in the nFET and pFET regions of the structure 20. The gate dielectric layer can be a high dielectric constant (high-k) material layer having a dielectric constant greater than 3.9. Gate dielectric layers can include a dielectric metal oxide in some embodiments, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition. The material(s) for forming the gate conductors can include electrically conductive material(s) deposited by physical vapor deposition, chemical vapor deposition, and/or electroplating. A metal gate layer such as an aluminum layer, a tungsten layer, an aluminum alloy layer, or a tungsten alloy layer is formed in some embodiments. Tungsten, for example, can be deposited by chemical vapor deposition. Replacement gate fabrication techniques are employed in some embodiments to obtain the gate regions 26.

Silicon nitride ($Si_3N_4$) layer can be deposited via CVD, PECVD, sputtering, or other suitable technique to form the spacers 28. The spacers can include a single layer or be multi-layer. Spacer thickness is between two and ten nanometers (2-10 nm) in some embodiments. Spacers can be formed by any method known in the art, including depositing a conformal nitride layer over dummy gate structures (not shown) and removing unwanted material using an anisotropic etching process such as reactive ion etching or plasma etching. The dummy gates and associated spacers protect the underlying portions of the semiconductor fins that later function as channel regions of FinFET devices in embodiments where FinFETs comprise the field-effect transistors within the structure 20.

An electrically insulating layer 30, for example silicon dioxide, can be formed on the structure 20 using CVD or other known techniques. Other low-k dielectrics can alternatively be employed to form the layer 30, for example SiOCH. The electrically insulating layer 30 may be planarized using chemical mechanical planarization (CMP), as known in the art. The layer 30 is patterned using a photoresist layer (not shown) and etched to form trenches 32. The trenches extend to the source/drain regions 24A, 24B. A titanium layer is conformally deposited on the structure, lining the surfaces of the dielectric layer and the exposed portions of the source/drain regions. The thickness of the titanium layer is between 30-80 Å in some embodiments. Radio-frequency enhanced physical vapor deposition (RF PVD) is a known technique for depositing thin metal films in vias and contact holes, and may be employed for depositing the titanium layer. A titanium nitride (TiN) layer is deposited on the titanium layer using, for example, atomic layer deposition. The TiN layer protects the titanium layer from oxidation. The deposited titanium and titanium nitride layers are collectively designated by numeral 34 in FIG. 1.

Figure 2:
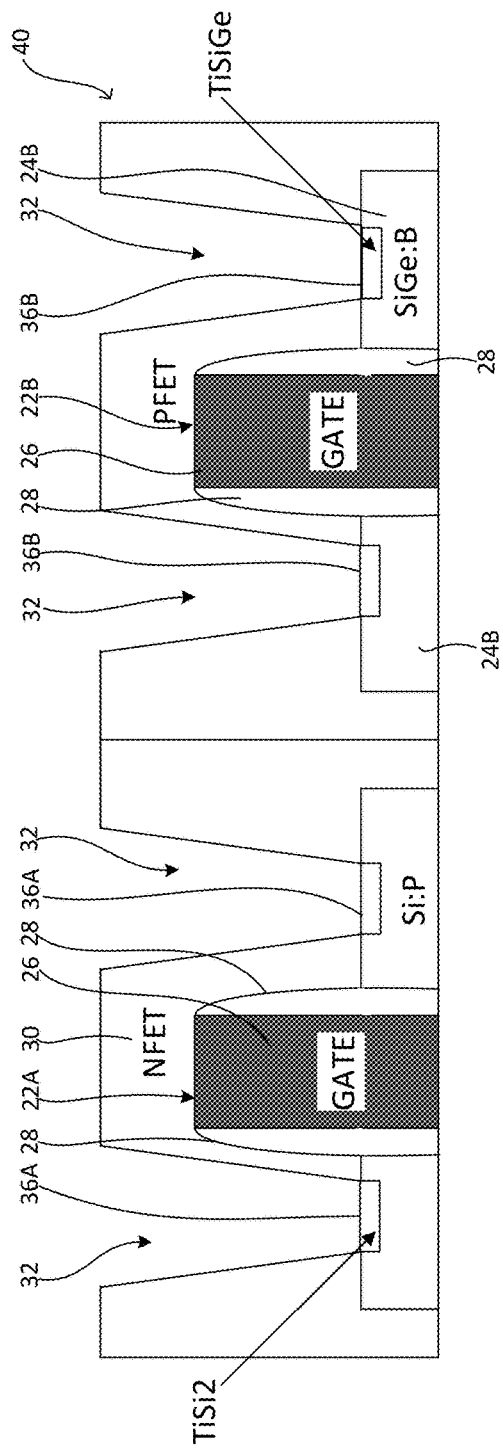
FIG. 2 is a schematic, cross-sectional view thereof following silicidation and removal of unreacted titanium and titanium nitride.

Unreacted titanium/titanium nitride is selectively removed from the structure following post-silicidation anneal to form titanium disilicide ($TiSi_2$), leaving the dielectric surfaces of the trenches 32 exposed and titanium-based ($TiSi_2$) silicide regions 36A, 36B on the source/drain regions 24A, 24B. The selective removal of titanium-based materials from surfaces other than the silicide regions 36A, 36B may be conducted by a wet process using, for example, sulfuric peroxide mixture (SPM), which combines the use of sulfuric acid and hydrogen peroxide. The source/drain regions within the nFET region includes $TiSi_2$ regions 36A while $Ti(SiGe)_2$ regions 36B are formed on the source/drain regions 24B in the pFET region. The exemplary structure 40 shown in FIG. 2 is accordingly obtained.

Figure 3:
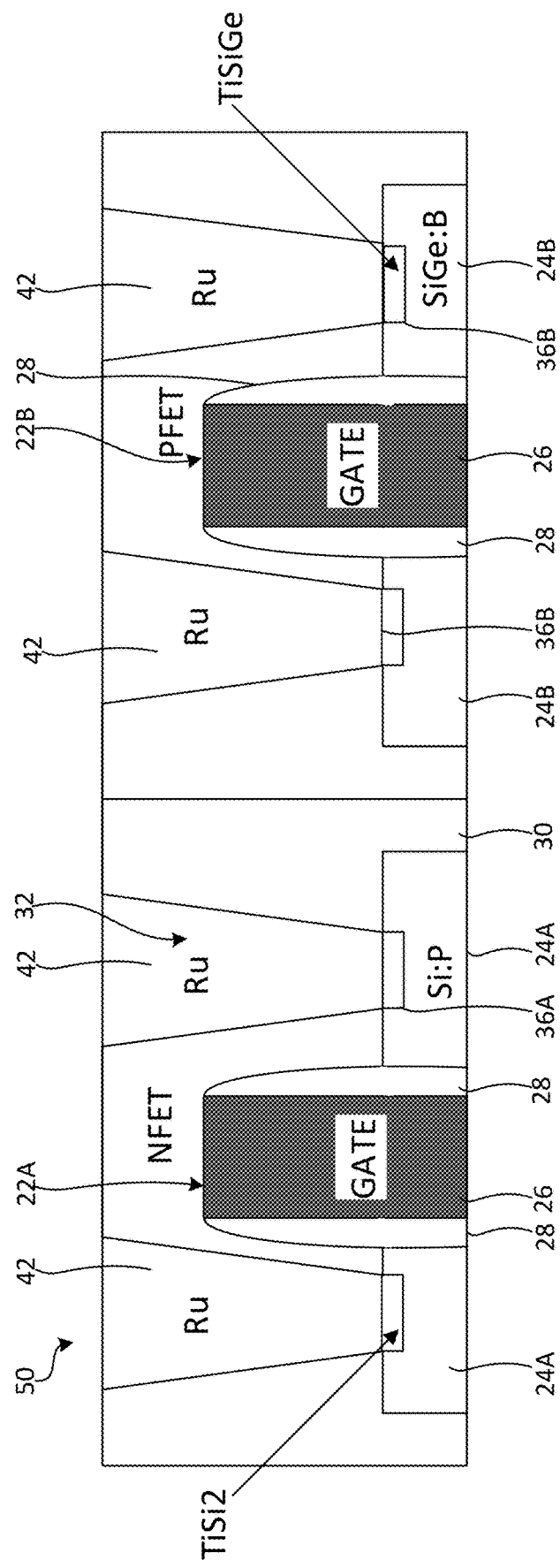
FIG. 3 is a schematic, cross-sectional view thereof following contact metallization.

FIG. 3 shows a completed structure 50 including contacts 42 formed within the trenches and electrically communicating with the silicide regions formed on the source/drain regions. Self-aligned contacts facilitate alignment during fabrication of integrated circuit devices having small dimensions. The contacts 42 are formed using at least two deposition stages.

The first stage includes a plasma-enhanced deposition process such as plasma-enhanced chemical vapor deposition (PECVD) or plasma-enhanced atomic layer deposition (PEALD). During the first stage, a continuous layer of contact metal such as ruthenium is formed directly on the silicide regions as well as directly on the surfaces of the dielectric layer bounding the trenches 32. In a first exemplary embodiment, a ruthenium layer is deposited using PECVD at a processing temperature in the range of 250-350° C. at 1.5 Torr with 400-600 W plasma power until a layer between 0.5-2.0 nm is formed. The thickness of the layer should be sufficient to ensure the absence of discontinuities in the layer formed on the dielectric surfaces during the first deposition stage.

Following completion of the first stage, which in some embodiments includes multiple plasma-enhanced deposition steps, the second stage includes the thermal chemical vapor deposition (CVD) of contact metal. In the first exemplary embodiment, ruthenium is deposited for 25-275 seconds at 1.5 Torr and at a process temperature of 250-350° C.

The PECVD process provides good nucleation while thermal CVD provides improved contact metal coverage on the trench sidewalls as compared to PECVD. Ruthenium metallization, for example, reduces interconnect resistance as compared to liner/barrier/nucleation films conventionally used in MOL metallization. The use of a non-halide precursor molecule, for example a metal-organic precursor as known in the art, eliminates the need for a halide-diffusion barrier. Being a high temperature refractory metal, there are no concerns relating to electromigration when employing ruthenium during both stages of the MOL metallization as described herein. Bulk resistivity of ruthenium is about 7.1 µOhm-cm.

As discussed above, the contact metal deposition includes more than one deposition process in some embodiments to produce a multi-layer structure. Contact metal, for example ruthenium, is deposited in a first stage using PECVD at a relatively high flow rate of carrier gas/metal precursor mixture to form a first layer and then is deposited in a second stage using thermal CVD at a lower flow rate of carrier gas/metal precursor mixture to form a second layer. As will be appreciated by the ordinary skilled worker, the metal precursor is entrained in the carrier gas from an ampoule, so that the ratio of metal precursor to carrier gas is substantially the same throughout the specified ranges of carrier gas/metal precursor mixture flow rate. Using process conditions described above with respect to PECVD contact metal deposition and thermal CVD, the relatively high flow rate of carrier gas/metal precursor mixture can be in the range of 50-200 sccm (e.g., 150 sccm) at a first ratio of metal precursor vapor to carrier gas, while the relatively low flow rate of carrier gas/metal precursor mixture is in the range of 20-100 sccm (e.g., 30 sccm) at a second ratio of metal precursor vapor to carrier gas, with the second ratio substantially the same as the first ratio. The "relatively high flow rate" and "relatively low flow rate" are by comparison with each other; i.e., the "relatively high flow rate" is greater than the "relatively low flow rate" in one or more embodiments. The deposition of two layers during a respective first stage and a respective second stage allows use of a PECVD process that provides good nucleation (small and closely packed crystals) but relatively high film resistivity, followed by use of a thermal CVD process that provides a relatively low-resistivity film (larger crystals). In some embodiments, both layers are the same material, for example ruthenium or other relatively low-resistivity metal. In other embodiments, the layers are formed from different materials, for example sequential layers of ruthenium, molybdenum, iridium, rhodium, osmium and/or their alloys.

In one or more embodiments, another aspect of the invention is that during the PECVD process both hydrogen and nitrogen gas are present to form the plasma, whereas during the thermal CVD process only hydrogen gas is present. As a result, different impurities (such as nitrogen) are present in the first metal layer deposited during the PECVD process, as compared to the second metal layer deposited during the thermal CVD process. An example of such an embodiment includes a first layer consisting of a mixture of ruthenium and ruthenium nitride (deposited by PECVD with nitrogen and hydrogen gas mixture), and a second layer consisting of ruthenium (deposited by thermal CVD with hydrogen gas).

FIGS. 1-3, as discussed above, depict exemplary processing steps/stages in the fabrication an exemplary structure. Although the overall fabrication method and the structure formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a structure 20 including a plurality of field-effect transistors 22A, 22B, each field-effect transistor including source/drain regions 24A, 24B, a dielectric layer 30 covering the plurality of field-effect transistors, and trenches 32 extending within the dielectric layer to the source/drain regions. Titanium-based silicide regions 36A, 36B are formed on the source/drain regions. A continuous contact metal layer is deposited directly on the silicide regions 36A, 36B and the dielectric layer 30 within the trenches 32 using a plasma-enhanced deposition process. Subsequent to depositing the contact metal surface layer, the trenches are filled with a contact metal fill layer using thermal chemical vapor deposition. The combined contact metal surface and fill layers formed in such a manner ensure adequate adhesion to the dielectric layer in the absence of relatively high resistivity liners while reducing interconnect resistance. In some embodiments, depositing the continuous contact metal surface layer by plasma-enhanced deposition (for example PECVD) process, then depositing the contact metal fill layer by thermal CVD, provides the contact metal fill layer with larger grain size and lower film resistivity than the continuous contact metal surface layer. The continuous contact metal surface layer and the contact metal fill layer may or may not comprise the same metal. Forming the titanium-based silicide regions may further include depositing one or more titanium-based materials on the structure such that a titanium-based layer 34 is formed on the source/drain regions and on surfaces of the dielectric layer within the trenches 32, annealing the structure to form the silicide regions 24A, 24B, and selectively removing the titanium-based materials from the structure to expose the surfaces of the dielectric layer 30 within the trenches, such as shown in FIG. 2.

A semiconductor structure 50 is further provided that includes a plurality of field-effect transistors 22A, 22B, each field-effect transistor including source/drain regions 24A, 24B, a dielectric layer 30 covering the plurality of field-effect transistors, and trenches 32 extending within the dielectric layer to the source/drain regions. The source/drain regions include titanium-based silicide regions 36A, 36B. A continuous contact metal surface layer directly contacts the silicide regions and the dielectric layer within the trenches 32. A contact metal fill layer is in direct contact with the contact metal surface layer. PECVD layers typically exhibit higher resistivity than metal layers deposited using thermal CVD, so the continuous contact metal surface layer will have higher resistivity than the contact metal fill layer of the contacts 42 in at least some exemplary embodiments. The contact metal surface and fill layers fill the trenches 32. The contact metal surface layer adheres to the dielectric layer in the absence of a liner. In some embodiments, both the continuous contact metal surface layer and the contact metal fill layer comprise the same material, for example ruthenium. Both layers comprising each contact 42 may consist essentially of ruthenium.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices and contacts formed in accordance with one or more of the exemplary embodiments.

Given the teachings herein, it will be appreciated that in one aspect of the disclosure, an exemplary fabrication method for a semiconductor device includes obtaining a structure including a plurality of field-effect transistors, each field-effect transistor including source/drain regions, a dielectric layer covering the plurality of field-effect transistors, and trenches extending within the dielectric layer to the source/drain regions; forming titanium-based silicide regions on the source/drain regions; depositing a continuous contact metal surface layer directly on the silicide regions and the dielectric layer within the trenches using a plasma-enhanced deposition process at a first relatively higher flow rate of a first carrier gas and a first metal precursor vapor mixture, wherein the first metal precursor vapor flows at a first ratio to the flow of carrier gas, and subsequent to depositing the continuous contact metal surface layer, filling the trenches with a contact metal fill layer using thermal chemical vapor deposition at a second relatively lower flow rate of a second carrier gas and a second metal precursor vapor mixture, wherein the second metal precursor vapor flows at a second ratio to the flow of carrier gas, wherein the second ratio is substantially the same as the first ratio.

In one or more embodiments, a metal of the second metal precursor vapor mixture is selected from the group consisting of ruthenium, molybdenum, osmium, iridium and rhodium.

In one or more embodiments, the first metal precursor vapor mixture and the second metal vapor precursor mixture are of the same material.

In one or more embodiments, the first carrier gas consists essentially of hydrogen and nitrogen, and the second carrier gas consists essentially of hydrogen.

In one or more embodiments, a metal of the first metal precursor vapor mixture and a metal of the second metal precursor vapor mixture both consist essentially of ruthenium.

In another aspect of the disclosure, a semiconductor structure includes a plurality of field-effect transistors, each field-effect transistor including source/drain regions, a dielectric layer covering the plurality of field-effect transistors, and trenches extending within the dielectric layer to the source/drain regions; titanium-based silicide regions on the source/drain regions, and a plurality of metal contacts. Each metal contact includes a continuous contact metal surface layer directly contacting the silicide regions and the dielectric layer within the trenches, the continuous contact metal surface layer incorporating essentially only hydrogen and nitrogen impurities and having relatively small grain size, and a contact metal fill layer on the continuous contact metal surface layer and filling the trenches, the contact metal fill layer incorporating essentially only hydrogen impurities and having relatively larger grain size and relatively lower resistivity than the continuous contact metal surface layer.

In one or more embodiments, the contact metal fill layer and the continuous contact metal surface layer comprise ruthenium.

In one or more embodiments, the material of the continuous contact metal surface layer is selected from the group consisting of ruthenium, molybdenum, osmium, iridium and rhodium.

In one or more embodiments, the continuous contact metal surface layer and the contact metal fill layer comprise at least one of ruthenium, molybdenum, osmium, iridium and rhodium, and both the continuous contact metal surface layer and the contact metal fill layer are comprised of the same metal.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method comprising:
    obtaining a structure including a plurality of field-effect transistors, each field-effect transistor including source/drain regions, a dielectric layer covering the plurality of field-effect transistors, and trenches extending within the dielectric layer to the source/drain regions;
    forming titanium-based silicide regions on the source/drain regions;
    depositing a continuous contact metal surface layer directly on the silicide regions and the dielectric layer within the trenches using a plasma-enhanced deposition process at a first flow rate of a first carrier gas and a first metal precursor vapor mixture, wherein the first metal precursor vapor flows at a first ratio to the flow of carrier gas, and
    subsequent to depositing the continuous contact metal surface layer, filling the trenches with a contact metal fill layer using thermal chemical vapor deposition at a second flow rate of a second carrier gas and a second metal precursor vapor mixture, wherein the first flow rate is greater than the second flow rate, wherein the second metal precursor vapor flows at a second ratio to the flow of carrier gas, wherein the second ratio is substantially the same as the first ratio, and wherein the first carrier gas consists essentially of hydrogen and nitrogen, and the second carrier gas consists essentially of hydrogen.

2. The method of claim 1, wherein a metal of the second metal precursor vapor is selected from the group consisting of ruthenium, molybdenum, osmium, iridium and rhodium.

3. The method of claim 2, wherein the first metal precursor vapor and the second metal vapor precursor are of the same material.

4. The method of claim 1, wherein a metal of the first metal precursor vapor and a metal of the second metal precursor vapor both consist essentially of ruthenium.

* * * * *